United States Patent
Hsu

(10) Patent No.: US 8,315,063 B2
(45) Date of Patent: Nov. 20, 2012

(54) SOLDER PAD STRUCTURE WITH HIGH BONDABILITY TO SOLDER BALL

(75) Inventor: Jun-Chung Hsu, Taoyuan (TW)

(73) Assignee: Kinsus Interconnect Technology Corp., Taoyuan (TW)

( * ) Notice: Subject to any disclaimer, the term of this patent is extended or adjusted under 35 U.S.C. 154(b) by 485 days.

(21) Appl. No.: 12/547,495

(22) Filed: Aug. 26, 2009

(65) Prior Publication Data
US 2011/0048782 A1   Mar. 3, 2011

(51) Int. Cl.
*H05K 7/00* (2006.01)

(52) U.S. Cl. ............ 361/767; 361/760; 29/847; 29/832; 174/263

(58) Field of Classification Search ............ 361/767, 361/768, 760; 174/262, 263; 29/852, 847, 29/832, 846, 831; 257/737
See application file for complete search history.

(56) References Cited

U.S. PATENT DOCUMENTS

| 2006/0035453 A1* | 2/2006 | Kim et al. ............ 438/613 |
| 2009/0032294 A1* | 2/2009 | Hsu ............ 174/257 |

\* cited by examiner

*Primary Examiner* — Hoa C Nguyen
(74) *Attorney, Agent, or Firm* — Lin & Associates IP, Inc.

(57) ABSTRACT

A solder pad structure with a high bondability to a solder ball is provided. The present invention provides a larger contact area with the solder ball so as to increase the bondability according to the principle that the bondability is positive proportional with the contact area therebetween. The solder pad structure includes a circuit board having a solder pad opening defined by a solder resist layer surrounding a circuit layer. The circuit layer within the solder pad opening is defined as a solder pad. In such a way, after filling the solder ball into the solder pad opening, besides walls of the solder pad opening, there is an extra contact area provided by a geometric shape of the solder pad for further improving the bondability of the solder pad and the solder ball.

5 Claims, 4 Drawing Sheets

SOLDER PAD STRUCTURE WITH HIGH BONDABILITY TO SOLDER BALL

BACKGROUND OF THE INVENTION

1. Field of the Invention

The present invention relates generally to a solder pad structure, and in particular, to a solder pad structure with high bondability to a solder ball.

2. The Prior Arts

Recently, electronic products are developed smaller and smaller. Correspondingly, openings of electronic points on substrates, for example those openings for solder ball pads or bump pads, as well as the solder balls or bumps filled in the openings are also configured smaller and smaller. For example, a pitch of a ball grid array (BGA) solder pad is now configured with a size of 0.4 mm, or even 0.3 mm, comparing with the previous typical sizes thereof about 1 mm. Further, a typical solder mask (SM) solder pad opening is diminished from a previous size about 350 μm to a current size under 200 μm. Similarly, a typical flipchip solder pad opening is also diminished from a size about 100 μm to about 70 μm. However, this trend also causes a great difficulty on the packaging process.

Bondability between a solder ball and a solder pad is generally positive proportional with a contact area of the solder ball and the solder pad. As such, when the sizes of the solder ball and the solder pad become smaller and smaller, the bondability therebetween decreases correspondingly. A lower bondability between the solder ball and the solder pad only causes dropping off, peeling off, crack of the solder ball from the solder pad after being packaged when suffering external forces. This may cause disconnection of electronic points, and opening of the circuit thereof. As such, upon the configuration of small size solder pad and solder ball, how to improve the bondability therebetween becomes an important concern in this art.

For example, electronic components for handheld devices are often required to be tested by dropping test, so as to guarantee the final products will not be damaged due to failures caused by unconscious dropping on the ground. The failures hereby often are cracks happened to the solder balls when impacted by the dropping. An IC chip in an encapsulation process is often processed by implanting a solder ball after being assembled to the substrate. Thereafter, the assembler then disposes the encapsulated component on a PCB solder pad with assembly equipment. A solder ball of the IC chip is melted and then welded to the PCB by a reflow process. In general, solder pads of a PCB often are greater than that of IC substrates, and therefore the problems of reliability of the interfaces between the solder balls and the solder pads are more likely to happen at the IC substrate side. In this manner, when an electronic product is impacted, a crack is often seen at an inter-metallic compound (IMC) layer configured by the IC substrate and the solder pad, for example, typically a cell phone dropped on ground often cannot be turned on.

Generally speaking, in order to obtain a better bondability between the solder ball and the solder pad, a solder resist opening (SRO) is usually enlarged. However, as the entire component is desired to be smaller, the size of the SRO is strictly restricted. Further, an enlarged SRO often requires more precise image transferring and alignment exposure, which requires excessive equipment and higher cost. Furthermore, in order to prevent the IMC layer from being thickened due to the reflow processes, a thin layer of palladium is sometimes introduced between a nickel layer and a gold layer to depress the thickening of the IMC layer. However, the introducing of the palladium layer requires modification of the plating equipment. Moreover, palladium is very expensive metal element, thus the use of palladium increases the production cost.

SUMMARY OF THE INVENTION

A primary objective of the present invention is to provide a solder pad structure with a high bondability to a solder ball. The present invention provides a larger contact area with the solder ball so as to increase the bondability according to the principle that the bondability is positively proportional with the contact area therebetween. The present invention provides a solder pad having a certain geometric shape so as to increase the contact area and strengthen the structure thereof, and thus increasing the bondability with the solder ball.

Another objective of the present invention is to provide a solder pad structure with high bondability to a solder ball. The solder pad structure configures a T bone structure and embeds the same into the solder ball so as to resist stress caused by the dropping of the electronic product.

For achieving the foregoing objectives, the present invention provides a solder pad structure with high bondability to a solder ball. The solder pad structure has a certain geometric shape so as to increase a contact area with the solder ball filled therein to improve the bondability with the solder ball. In a circuit board, a solder pad opening is configured by a solder resist layer surrounding a circuit layer, in which the circuit layer within the solder pad opening is defined as a solder pad. In such a way, when a solder ball is filled in the solder pad opening, besides walls of the solder pad opening, the certain geometric shape of the solder pad provides an extra contact area with the solder ball, and thus improves the bondability for the solder ball.

BRIEF DESCRIPTION OF THE DRAWINGS

The present invention will be apparent to those skilled in the art by reading the following detailed description of a preferred embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

The present invention provides a solder pad structure with a high bondability to a solder ball. The solder pad structure has a certain geometric shape so as to increase a contact area with the solder ball filled therein to improve the bondability with the solder ball. In a circuit board, a solder pad opening is configured by a solder resist layer surrounding a circuit layer, in which the circuit layer within the solder pad opening is defined as a solder pad. In such a way, when a solder ball is filled in the solder pad opening, besides walls of the solder pad opening, the certain geometric shape of the solder pad provides an extra contact area with the solder ball, and thus improves the bondability for the solder ball. Different geometric shapes of the solder pad are to be illustrated in the following embodiments shown with different cross-sectional views.

Figure 1B:
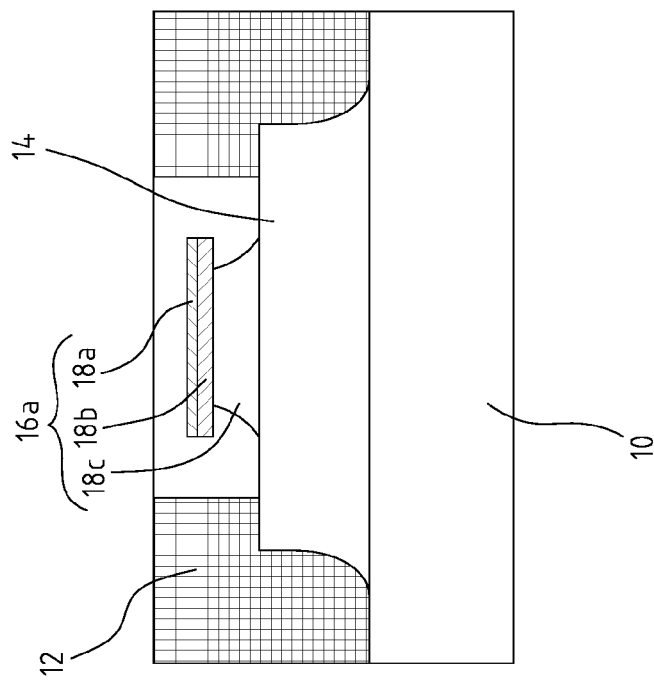
FIGS. 1A and 1B are schematic diagrams illustrating a solder pad structure with high bondability to a solder ball in accordance with a first embodiment of the present invention.
Figure 1A:
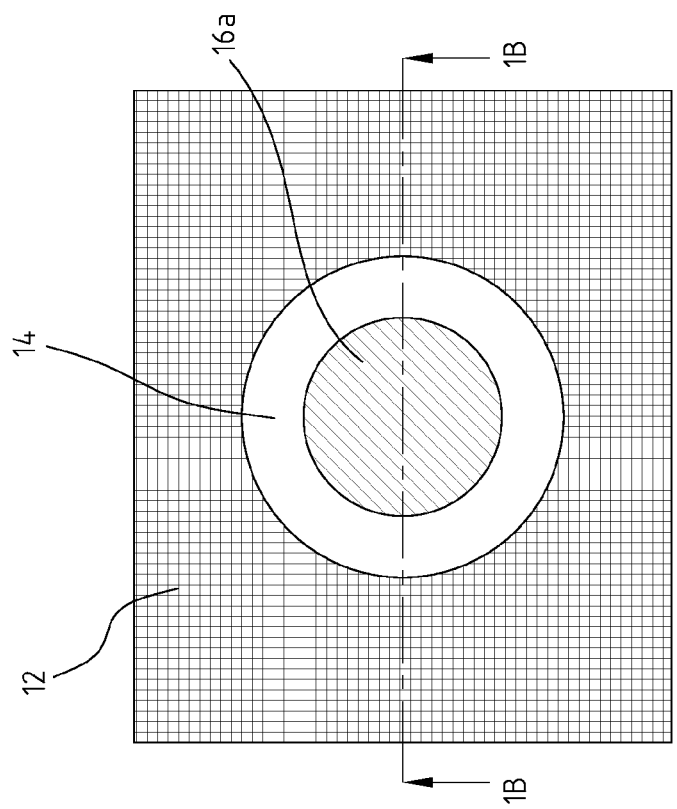

FIGS. 1A and 1B are schematic diagrams illustrating a solder pad structure with a high bondability to a solder ball in accordance with a first embodiment of the present invention. FIG. 1B is a cross-sectional view of FIG. 1A taken along the line 1B-1B of FIG. 1A. Referring to FIGS. 1A and 1B, there is shown a circuit board 10 having a solder pad opening defined by a solder resist layer 12 surrounding a circuit layer. The circuit layer within the solder pad opening is defined as a solder pad 14. In order to improve the bondability of the solder pad 14 with a solder ball, according to an aspect of the present invention, the solder pad 14 is designed to have a certain geometric shape 16a with a cross-sectional view of a T shape or an anchor shape.

In order to produce the desired the geometric shape 16a of the T shape or the anchor shape, a first plating metal 18a, 18b and a second plating metal 18c are plated on the solder pad 14. As can be seen in FIG. 1B, the second plating metal 18c is plated on the solder pad 14 and the first metal 18a, 18b is plated on the second plating metal 18c. Then, a selective etching is performed with the first plating metal 18a, 18b serving as an etching mask, so that the second plating metal 18c is etched and configured to have an inward recess. In such a way, the solder pad 14 can have the certain geometric shape 16a with a cross-sectional view of a T shape or an anchor shape. Please note, according to an aspect of the embodiment, for the convenience of selective etching, areas of the first plating metal 18a, 18b, and the second plating metal 18c are preferably smaller than the solder pad 14.

In more details, the solder pad 14 is preferably a BGA solder pad. The first plating metal 18a, 18b is copper or nickel alloy, and the second plating metal 18c is copper. As such, when being flash etched, the first plating metal 18a, 18b made of nickel alloy can serve as an etching mask and remains its original form after the etching process, and configures a cliff ("E") shaped T bone as shown in FIG. 1B. In such a way, the plated metal can be prevented from being melted into the solder ball, and the height of the original plating layer can be sustained. The configuration of the T bone advantageously strengthens the force of holding the solder ball. After implanting the solder ball, and the reflow process, the solder ball fills in the space under the cliff. And therefore, the first plating metal 18a, 18b forms a strengthening bone in the solder ball to hold the solder ball and resist forces applied thereto, and thus improves the bondability of the solder pad structure for the solder ball.

Figure 2B:
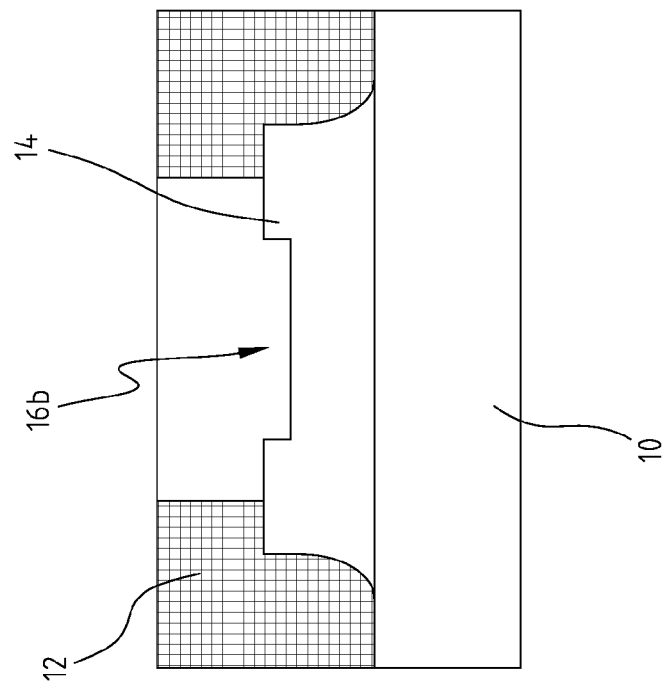
FIGS. 2A and 2B are schematic diagrams illustrating a solder pad structure with a high bondability to a solder ball in accordance with a second embodiment of the present invention.
Figure 2A:
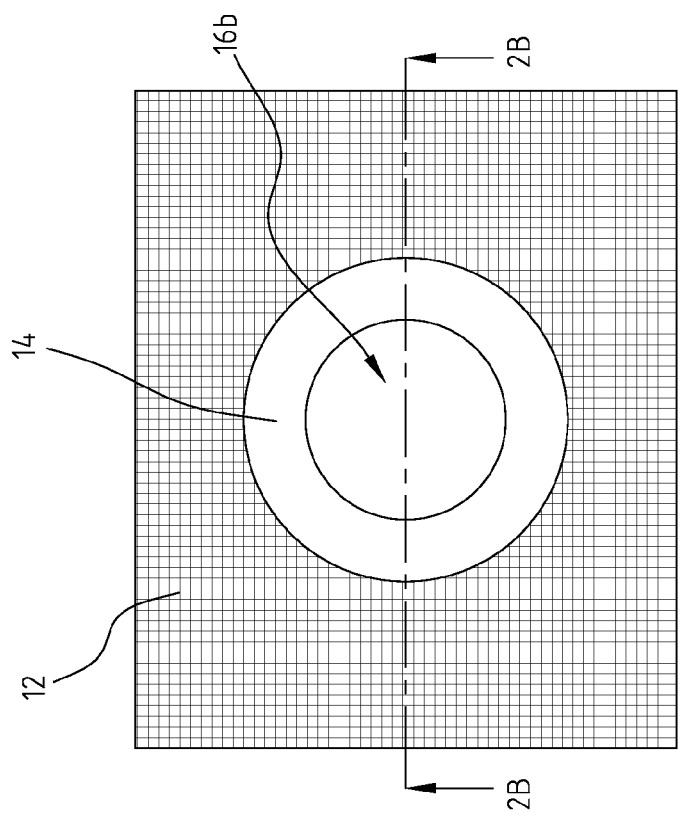

FIGS. 2A and 2B are schematic diagrams illustrating a solder pad structure with a high bondability to a solder ball in accordance with a second embodiment of the present invention. FIG. 2B is a cross-sectional view of FIG. 2A taken along the line 2B-2B of FIG. 2A. Referring to FIGS. 2A and 2B, there is shown a circuit board 10 having a solder pad opening defined by a solder resist layer 12 surrounding a circuit layer. The circuit layer within the solder pad opening is defined as a solder pad 14. In order to improve the bondability of the solder pad 14 with a solder ball, according to an aspect of the present invention, the solder pad 14 is designed to have a geometric shape 16b with a cross-sectional view of an inward recess shape as shown in FIG. 2B. In such a way, after filling the solder ball into the solder pad opening, besides walls of the solder pad opening, there is an extra contact area provided by the inward recess geometric shape 16b for further improving the bondability of the solder pad structure for the solder ball.

Figure 3B:
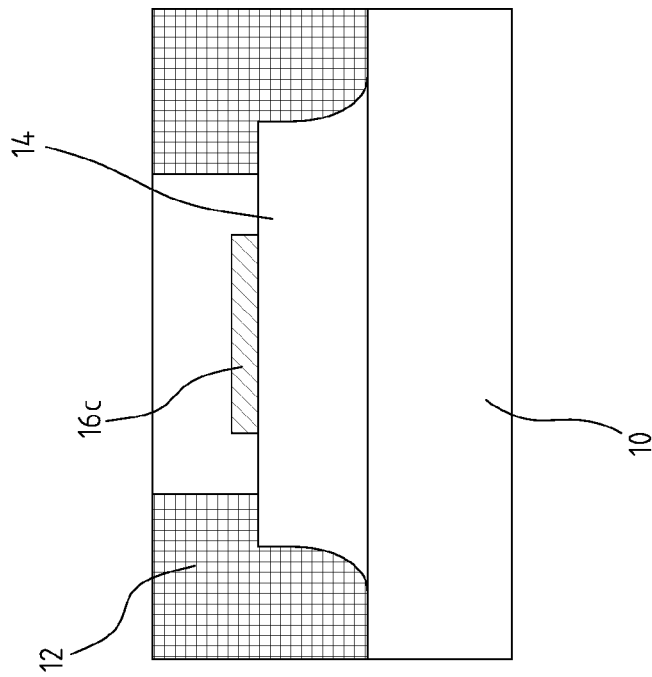
FIGS. 3A and 3B are schematic diagrams illustrating a solder pad structure with a high bondability to a solder ball in accordance with a third embodiment of the present invention.
Figure 3A:
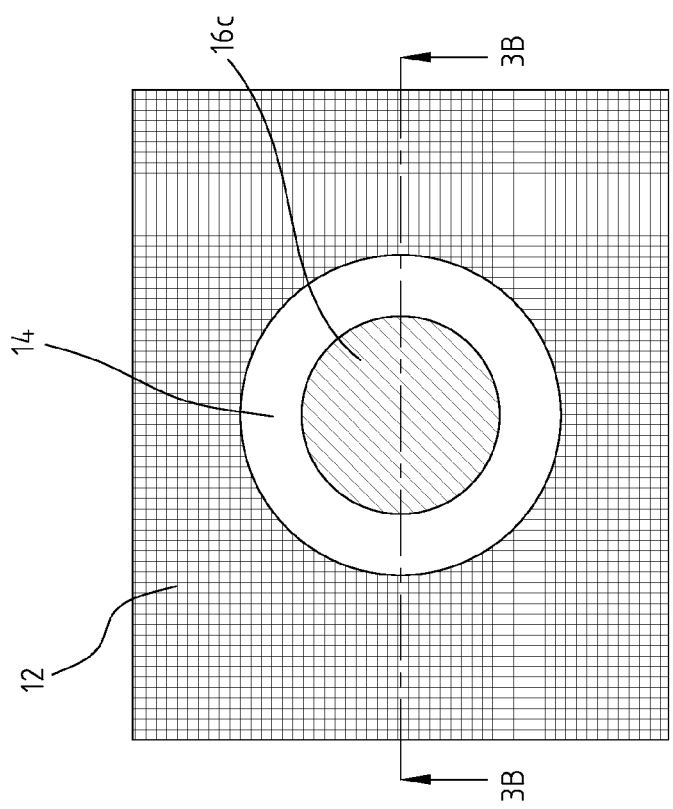

FIGS. 3A and 3B are schematic diagrams illustrating a solder pad structure with a high bondability to a solder ball in accordance with a third embodiment of the present invention. FIG. 3B is a cross-sectional view of FIG. 3A taken along the line 3B-3B of FIG. 3A. Referring to FIGS. 3A and 3B, there is shown a circuit board 10 having a solder pad opening defined by a solder resist layer 12 surrounding a circuit layer. The circuit layer within the solder pad opening is defined as a solder pad 14. In order to improve the bondability of the solder pad 14 with a solder ball, according to an aspect of the present invention, the solder pad 14 is designed to have a geometric shape 16c with a cross-sectional view of an upward protrusion shape as shown in FIG. 3B. In such a way, after filling the solder ball into the solder pad opening, besides the walls of the solder pad opening, there is an extra contact area provided by the upward protrusion geometric shape 16c for further improving the bondability of the solder pad structure for the solder ball.

Figure 4B:
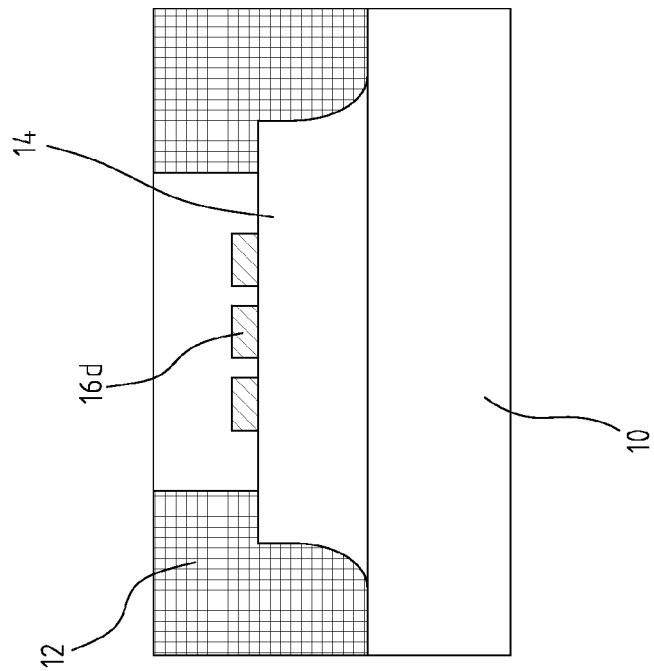
FIGS. 4A and 4B are schematic diagrams illustrating a solder pad structure with a high bondability to a solder ball in accordance with a fourth embodiment of the present invention.
Figure 4A:
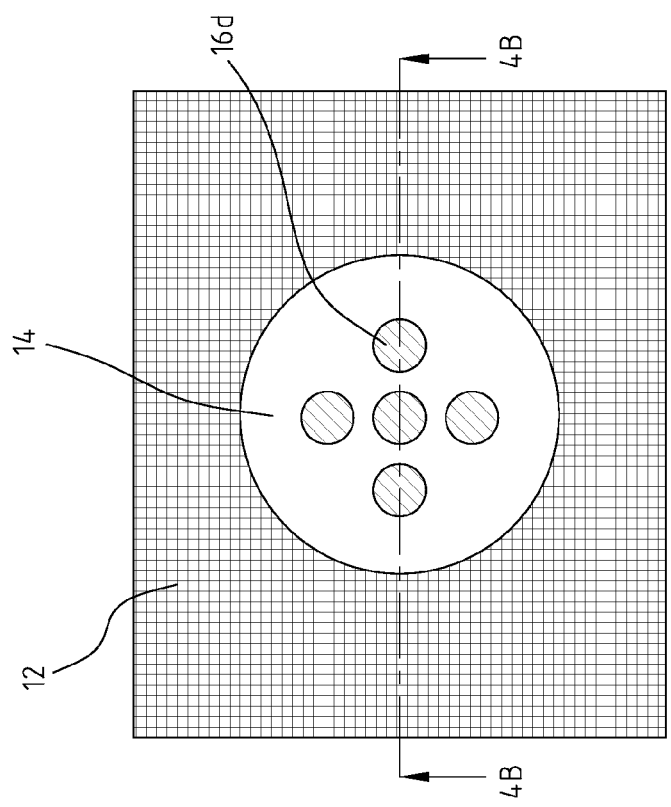

FIGS. 4A and 4B are schematic diagrams illustrating a solder pad structure with a high bondability to a solder ball in accordance with a fourth embodiment of the present invention. FIG. 4B is a cross-sectional view of FIG. 4A taken along the line 4B-4B of FIG. 4A. Referring to FIGS. 4A and 4B, there is shown a circuit board 10 having a solder pad opening defined by a solder resist layer 12 surrounding a circuit layer. The circuit layer within the solder pad opening is defined as a solder pad 14. In order to improve the bondability of the solder pad 14 with a solder ball, according to an aspect of the present invention, the solder pad 14 is designed to have a plurality of geometric shapes 16d each having a cross-sectional view of an upward protrusion shape as shown in FIG. 4B. In such a way, after filling the solder ball into the solder pad opening, besides walls of the solder pad opening, there are extra contact areas provided by the upward protrusion geometric shapes 16d for further improving the bondability of the solder pad structure for the solder ball.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A solder pad structure with a high bondability to a solder ball, comprising a circuit board having a solder pad opening defined by a solder resist layer surrounding a circuit layer, the circuit layer within the solder pad opening being defined as a solder pad, wherein a T shape structure is formed on the solder pad to increase a contact area for a solder ball to be filled in, and the T shape structure comprises a first plating metal plated on a second plating metal which is plated on the solder pad with the second plating metal being etched to have an inward recess shape below the first plating metal to form the T shape structure on the solder pad.

2. The solder pad structure according to claim 1, wherein the first plating metal is copper or nickel alloy, and the second plating metal is copper.

3. A method of manufacturing a solder pad structure with a high bondability to a solder ball, the solder pad structure comprising a circuit board having a solder pad opening defined by a solder resist layer surrounding a circuit layer, the circuit layer within the solder pad opening being defined as a solder pad, the method comprising:

plating a second plating metal on the solder pad and a first plating metal on the second plating metal;

using the first plating metal as an etching mask to perform a selective etching to etch the second plating metal to form an inward recess shape below the first plating metal so that a T shape structure is formed on the solder pad.

4. The method according to claim 3, wherein the first plating metal is copper or nickel alloy, and the second plating metal is copper.

5. The method according to claim 3, wherein areas of the first plating metal and the second plating metal are smaller than the solder pad.

* * * * *